United States Patent [19]

Zega

[11] 4,407,713

[45] Oct. 4, 1983

[54] CYLINDRICAL MAGNETRON SPUTTERING CATHODE AND APPARATUS

[75] Inventor: Bogdan Zega, Geneva, Switzerland

[73] Assignee: Battelle Development Corporation, Columbus, Ohio

[21] Appl. No.: 290,426

[22] Filed: Aug. 6, 1981

[30] Foreign Application Priority Data

Aug. 8, 1980 [EP] European Pat. Off. ........ 80200753.4

[51] Int. Cl.³ ............................................. C23C 15/00
[52] U.S. Cl. ................................. 204/298; 204/112 R
[58] Field of Search ................ 204/192 R, 192 C, 298

[56] References Cited

U.S. PATENT DOCUMENTS

| 3,884,793 | 5/1975 | Penfold et al. | 204/298 |
| 3,919,678 | 11/1975 | Penfold | 335/296 |
| 3,995,187 | 11/1976 | Penfold et al. | 313/346 R |
| 4,030,996 | 6/1977 | Penfold et al. | 204/192 R |
| 4,031,424 | 6/1977 | Penfold et al. | 313/346 |
| 4,179,351 | 12/1979 | Hawton et al. | 204/298 |
| 4,198,283 | 4/1980 | Class et al. | 204/298 |
| 4,221,652 | 9/1980 | Kuriyama | 204/298 |
| 4,356,073 | 10/1982 | McKelvey | 204/192 R |

FOREIGN PATENT DOCUMENTS

| 2707144 | 8/1977 | Fed. Rep. of Germany | 204/298 |
| 53-58489 | 5/1978 | Japan | 204/298 |

OTHER PUBLICATIONS

"End Effects in Cylindrical Magnetron Sputtering Sources"–J. A. Thorton; *Journal of Vacuum Science Technology*, vol. 16(1) Jan./Feb. 1979, pp. 79–80.

"Design and Capabilities of a Novel Cylindrical Post Magnetron Sputtering Source" D. W. Hoffman–Ford Motor Co.; paper presented 4/5/82 in San Diego.

S. Schiller et al., "On the Use of Ring Gap Discharges for High-Rate Vacuum Coating", *J. Voc. Sci. Technol.*, vol. 14, pp. 815–818 (1977).

"Thin Film Processes" (Edited by Vossen & Kern) Academic Press (1978); pp. 76–113, "Cylindrical Magnetron Sputtering"–J. A. Thorton & A. S. Penfold.

"Advances in High Rate Sputtering with Magnetron–Plasmatron Processing and Instrumentation"–S. Schiller et al.; *Thin Solid Films*, vol. 64 (1979) pp. 455–467.

*Primary Examiner*—Aaron Weisstuch
*Attorney, Agent, or Firm*—Barry S. Bissell

[57] ABSTRACT

The cylindrical magnetron sputtering cathode (10) of the present invention essentially comprises a tubular target (20) having a face (20a) of material to be sputtered, and a magnet assembly (45) disposed behind the back face of said tubular target for generating magnetic fields having flux lines which form arch portions (50,51) over the sputtering face. This magnet assembly (45) more specifically consists of a plurality of equiangularly spaced axially extending radially magnetized magnets arranged in such a manner as to form over the sputtering face (20a) a plurality of equiangularly spaced axially extending straight arch portions (50) connected to each other by arcuate arch end-portions (51), whereby defining at least one closed-loop arch (52) over said sputtering face. This magnetron sputtering cathode further comprises closure means for delimitating in combination with the back face of said tubular target a cylindrical tight chamber enclosing the magnet assembly, as well as means for axially circulating a liquid coolant within said tight chamber, whereby ensuring a proper cooling of said cathode by enabling said liquid coolant to freely flow along the longitudinal spaces (49) delimitated between adjacent magnets of said assembly.

11 Claims, 11 Drawing Figures

CYLINDRICAL MAGNETRON SPUTTERING CATHODE AND APPARATUS

FIELD OF THE INVENTION

The present invention relates to a cylindrical magnetron sputtering cathode, as well as to a sputtering apparatus for coating substrates which utilizes the cathode.

BACKGROUND OF THE INVENTION

The development of magnetically-enhanced cathodic sputtering is providing a major contribution to the coating field, because of the much higher deposition rates compared with those obtained with conventional sputtering, which make it possible to produce coatings for many industrial applications.

Magnetically-enhanced cathodic sputtering is generally carried out with either planar or cylindrical configurations, of which only the cylindrical configurations will be considered herein. The first magnetically-enhanced sputtering system to have a cylindrical configuration was a system of the Penning-type, designed for applying inside the annular interspace extending between a central cylindrical sputtering target and the substrates to be coated disposed concentrically around said central target, of an axial uniform magnetic field generated from the outside (of a Helmholtz-type coil disposed concentrically outside the vacuum bell jar). The sputtering rate increased only slightly as compared with conventional sputtering systems, taking into account the uniformity of the axial magnetic field which causes a slight intensification, but without confinement of the discharge plasma. Also, the Penning-type systems are further limited to the coating of substrates made of non-magnetic materials to avoid shielding the magnetic field generated from the outside.

The cylindrical magnetically-enhanced sputtering systems proposed herein are classified as "cylindrical magnetron sputtering" systems by U. Heisig et al. (cf. Paper "High Rate Sputtering with a Torus Plasmaton" from U. Heisig, K. Goedicke and S. Schiller—presented on 7th Int. Conf. on Electron and Ion Beam Science and Technology, Washington, D.C., USA, May 1976) or by N. Kuriyama (cf. German patent application No. 2,655,942 and U.S. Pat. No. 4,221,652). These "cylindrical magnetron sputtering" systems are designed for ensuring the application, over the sputtering face of a tubular target, of magnetic fields with flux lines forming a plurality of equiaxially spaced closed-loop toroidal arches circumferentially extending over the sputtering face, caused by a specific magnetron having a plurality of axially spaced ring magnets circumferentially exending against the back face of the target. The major advantage of such systems is the formation of a plurality of intense ring plasmas confined within these toroidal arches, which produces high sputtering rates of the tubular target. The major drawbacks of such systems involves poor target cooling and lack of uniformity of target sputtering and/or substrate coating, especially when using long targets to coat long substrates.

Proper cooling of the tubular target is rendered necessary because of excessive heating from the intense sputtering. Adequate cooling cannot be totally ensured because of the particular arrangement of the axially spaced ring magnets with respect to the tubular target, which put a severe restraint on the axial circulation of the liquid coolant along the back face of the tubular target. Also, in such a magnetron the liquid coolant generally cannot contact the annular regions of the back face of the target at the level of which the ring plasmas are confined, and so the heating is more intense. Obtainment of a uniform target sputtering and/or substrate coating appears unreliable, even with the to-and-fro axial motion of the magnetron with respect to the tubular target, because of the instability of the separate ring plasmas sustained by such a magnetron. It is known that the current-voltage characteristic of magnetrons flattens for high currents, which means that the plasma impedance decreases with increasing current. The design of a magnetron intended to sustain a plurality of separate confined plasmas constitutes a design very sensitive to the occurrence of any dissymetry (whether caused by the geometry of the different magnets, the strength of the magnetic field generated by these different magnets, or any other type of dissymmetry, such as the to-and-fro axial motion of the magnetron with respect to the tubular target). Separate plasmas act as electrical circuit elements in parallel and the occurrence of any dissymmetry results in a current disequilibrium between the separate plasmas acting as electrical elements in parallel. This disequilibrium deteriorates with time because the plasma impedance decreases with increasing current, thereby endangering the uniformity of target sputtering and/or substrate coating (the to-and-fro axial motion of the magnetron with respect to the tubular target being totally unable to restore such uniformity along the whole length of this target).

The German Patent application No. 2,707,144 (assigned to the Sloan Technology Corp.) describes (cf. FIGS. 18 and 19 of that application) a cylindrical magnetron sputtering system which is designed for generating over the sputtering face of a tubular target a simple closed-path magnetic tunnel, which axially extends along the full length of the tubular target while circumferentially extending along a small region of this tubular target (such single closed-path magnetic tunnel being generated by a magnet arrangement behind the back face of the tubular target having an extension similar to that of the magnetic tunnel to be generated). This system requires the complete rotation of the magnet arrangement by at least one turn, so as to ensure the uniform sputtering of the whole target. The complete rotation also results in lower sputtering rates. No information is given concerning the target cooling.

OUTLINE OF THE INVENTION

The object of the present invention is to remedy the aforementioned drawbacks, in proposing a cylindrical magnetron sputtering system capable of ensuring a high-rate sputtering of tubular targets of relatively great length with proper cooling of the targets, while also enabling uniform target sputtering and/or substrate coating.

For this purpose, the present invention relates to a cylindrical magnetron sputtering cathode comprising:
  a tubular target having a face of material to be sputtered,
  a magnet assembly disposed behind the back face of the tubular target opposed to the sputtering face for generating magnetic fields having flux lines which project in a curve from the sputtering face and return to form arch portions thereover, the magnet assembly consisting of a plurality of equiangularly spaced axially extending radially magnetized magnets arranged in such a manner that their flux lines form over the sputtering face of a plurality of equiangularly spaced axially extending straight arch portions connected to each other by arcuate arch end-portions, whereby defining at least one closed-loop arch over the sputtering face, closure means for delimitating in combination with the back face of the tubular target a cylindrical fluid tight chamber enclosing at least partially the magnet assembly, and, means for axially circulating a liquid coolant within the fluid tight chamber, whereby the liquid coolant can freely flow from one end to the other end of the chamber, along the longitudinal spaces delimitated between adjacent magnets of the plurality of equiangularly spaced axially extending magnets.

The present invention also relates to a sputtering apparatus provided with such cathode.

It may be seen that one of the essential features of the present invention provides, against the back surface of a tubular target, a magnetron consisting of a plurality of equiangularly spaced axially extending radially magnetized magnets, which is designed for generating, over the sputtering face of said target, magnetic fields shaped in such a manner as to form a plurality of equiangularly spaced axially extending straight arch portions connected to each other by arcuate arch end-portions, defining at least one closed-loop arch over the sputtering face. Such a design offers the major advantage of ensuring an excellent target cooling whatever the target length, since the liquid coolant can be freely circulated along the longitudinal spaces delimitated between adjacent magnets, i.e. against the longitudinal regions of the tubular target where the sputtering, and the heating up, is more intense.

In order to enable a uniform target sputtering and substrate coating, the cylindrical magnetron sputtering system may also be provided with means for axially rotating the magnetron and the tubular target relative to each other (so as to cause a substantially uniform sputtering of said target, with a view towards improving target life) and for axially rotating the magnetron and the substrate relative to each other (so as to cause a substantially uniform coating of said substrate). Such a relative motion of the magnetron with respect to the tubular target and to the substrate may be carried out, either in a to-and-fro rotatory movement of an amplitude sufficient for causing at least one closed-loop magnetic arch generated by the magnetron to be scanned over the entire surface of the sputtering face of the tubular target as well as in front of the entire surface of the substrate to be coated, or otherwise according to an unidirectional rotatory movement causing full revolutions of the magnetron relative to the tubular target and the substrate. Such oscillatory or unidirectional relative motion may also involve rotating the magnetron alone while the tubular target and the substrate are fixed, or rotating both the target and the substrate (at identical or different speeds, and/or in the same or reverse direction) while the magnetron alone is stationary, or by rotating all three elements.

The magnet assembly of the present invention may be designed to generate arcuate magnetic arch end-portions which are connected alternately to the straight arch-portions, so as to define a single closed-loop arch extending in a meandering manner over the entire circumference of the sputtering face of the tubular target (said meandering arch causes the formation of a single intense plasma). Such magnets may, alternatively, be designed for generating arcuate arch end-portions which are connected by pairs to the corresponding straight arch portions, so as to define a plurality of closed-loop arches equiangularly spaced over the entire circumference of the sputtering face of said tubular target (the closed-loop arches cause the formation of a plurality of corresponding plasmas confined therewithin).

The first magnetron described above which forms a single plasma (extending in a meandering manner over the entire circumference of the sputtering target) offers the major advantage, with respect to the second design (as well as the designs of the prior art) which forms a plurality of separate plasmas, by ensuring a much better uniformity of target sputtering and/or substrate coating. The formation of a single meandering plasma results in a plasma current which is relatively uniform along its whole path (because of the trapped electrons circulating along a single and same plasma), so that no current disequilibrium which could endanger the uniformity of target sputtering (and therefore that of substrate coating) can arise through dissymmetry.

The magnetron of the present invention comprises a first group of equiangularly spaced radially magnetized main magnets (in even numbers and with alternate polarity) which axially extend along almost the whole length of the cathode, so as to generate equiangularly spaced axially extending straight magnetic arch-portions, which first group of main magnets is completed by a second group of end-magnets arranged in the prolongation of both ends of the main magnets of the first group, so as to generate the arcuate magnetic arch-portions connecting the straight arch portions. The arrangement of this second group of end-magnets with respect to the first group of main magnets is changed to obtain the first magnetron design generating a single closed-loop arch or the second magnetron design generating a plurality of closed-loop arches (the arrangement of the first group of main magnets remain unchanged in both cases). In both cases, the arrangement of this second group of end-magnets remains such that one-half of these end-magnets is disposed in the prolongation of the corresponding main magnets by being separated from them by intermediate gaps (while having an opposite polarity), whereas the other half of these end-magnets is disposed directly against the end of the corresponding main magnets while having the same polarity (the main and end-magnets of same polarity are directly in contact with each other, being able to be formed by a single magnet).

The different magnets are chosen so as to generate onto the sputtering face of the tubular target, magnetic fields having a strength of about 300 to 600 erstedts.

The cylindrical magnetron sputtering cathode and apparatus of the present invention may be designed, because of the different coating applications, to assume one of the two following configurations:

apparatus with a central cylindrical sputtering cathode, designed for coating substrates disposed concentrically outside the central cathode (single tubular substrate disposed coaxially around the cathode so as to be internally coated, or plurality of planar substrates disposed equiangularly around the cathode). The central sputtering cathode will consist of a tubular target having its outer face as the sputtering face, the magnetron being inserted inside the tubular target;

apparatus with a hollow cylindrical sputtering cathode, designed for coating substrates inserted axially inside the hollow cathode (rod-like or tubular substrate to be externally coated). The hollow sputtering cathode will consist of a tubular target having its inner face as the sputtering face, the magnetron being circumferentially arranged around the outer face of the tubular target.

In the cylindrical magnetron cathode and apparatus of the present invention, the magnetron may be arranged directly against the back face of the tubular sputtering target, or against a tubular intermediate support inserted between said tubular target and said magnetron. In the last case, the tubular target may be arranged in close contact against this intermediate support, or near the support, defining a gas tight chamber of low thickness to be used for cooling purposes. The thin gas tight chamber contains a gas having a high thermal conductivity under a pressure substantially higher than that inside the vacuum chamber. The piercing of the target will result in a gas irruption, which when detected will automatically shut-off the sputtering operation thereby preventing damage to the substrate and the magnetron while allowing optimum consumption of the target.

In the apparatus of the present invention, the anode may form the substrate proper (the substrate being grounded while the magnetron cathode is negatively biased to a high voltage), or by an intermediate grid interposed between the substrate and the magnetron cathode (the intermediate grid being grounded or positively biased, while the substrate may be negatively or positively biased, or still left "floating").

BRIEF DESCRIPTION OF THE DRAWINGS

The accompanying drawings are diagrammatic illustrations by way of example of several embodiments of the cylindrical magnetron sputtering system according to the present invention.

SPECIFIC DESCRIPTION

FIGS. 1 to 4 relate to a first embodiment of the apparatus of the present invention, using a cylindrical magnetron sputtering cathode extending centrally inside the apparatus, so as to enable the coating of substrates disposed concentrically around the cylindrical cathode.

This first embodiment of FIGS. 1 to 4 comprises (FIG. 1) a bell jar 1 resting on a base plate 2, so as to form a sealed enclosure 3. The base plate 2 is provided with an evacuation port 4 connected (via a valve 5) to a suitable pumping device (not shown), and with an inlet port 6 connected by a gauged valve 7 to a source of an appropriate gas such as argon (not shown). The bell jar 1 is further provided with a pressure gauge 8.

Figure 1:
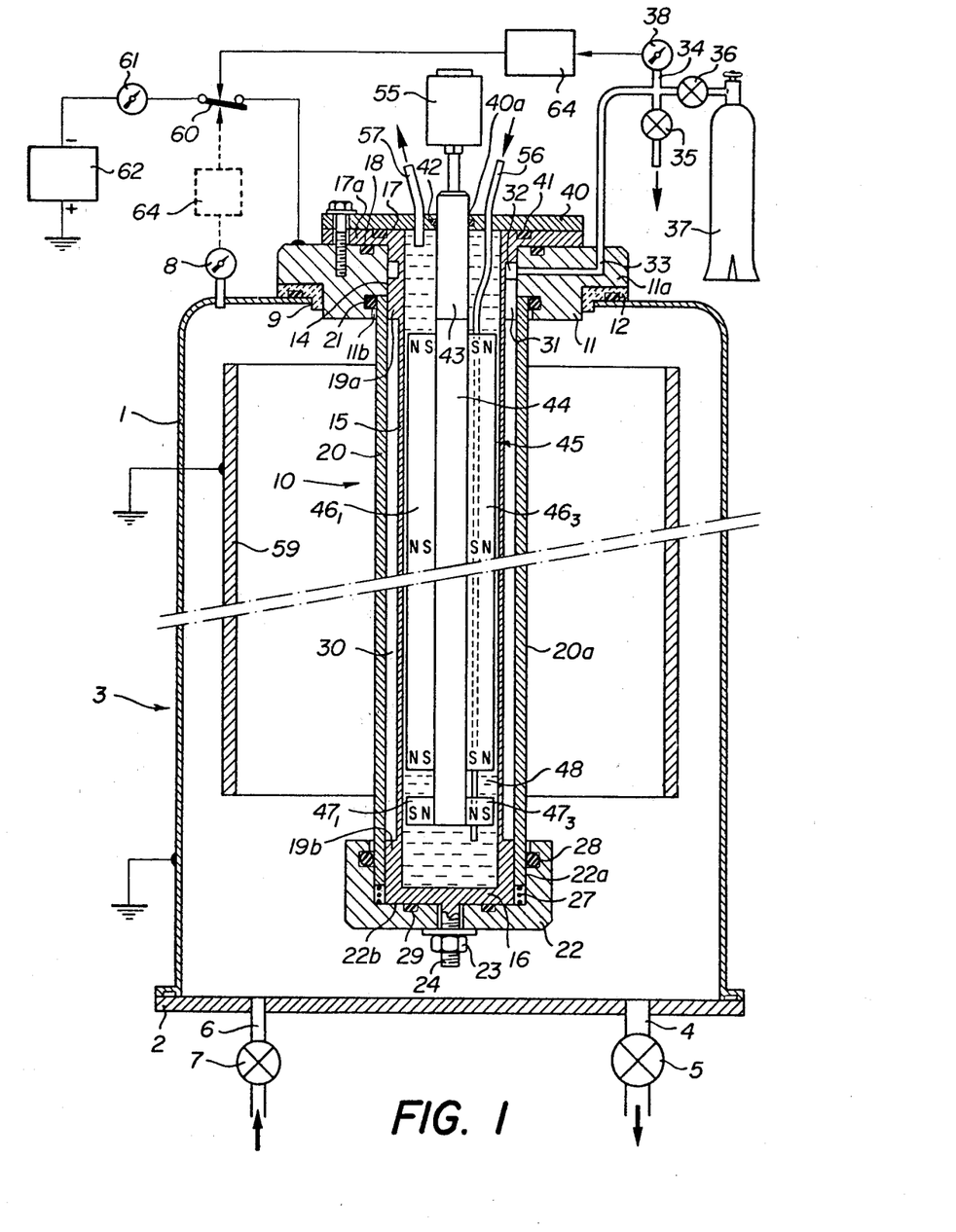
FIG. 1 is a diagrammatic sectional view of a first embodiment.

Through a central circular opening 9 provided in the top of the bell jar 1 is introduced a cylindrical magnetron sputtering cathode 10, which extends centrally inside the sealed enclosure 3. This cylindrical cathode 10 comprises at its upper end a discoidal metal block 11, which rests by means of an external flange 11a on the border of the opening 9, via an insulating ring 12. The discoidal metal block 11 is in turn provided with a central circular opening 14, through which is introduced a tubular sheath 15 with a flat bottom 16 and an open top 17, which rests by means of a top external flange 17a against the upper plane face of the block 11 (tightness between the flange 17a and the block 11 ensured by an O-ring 18). The tubular sheath 15, which is made of a high thermally-conducting material such as copper, is provided at both lateral ends with respective external annular shoulders 19a and 19b of low thickness, designed for fitting the internal diameter of the central opening 14 of the block 11.

Around the tubular sheath 15 is coaxially mounted an open-ended tubular target 20 made of a material to be sputtered, internally designed for fitting the respective end-shoulders 19a and 19b of the tubular sheath 15. The upper end of the tubular target 20 protrudes inside an annular recess 11b provided in the lower part of the block 11 for enlarging the corresponding lower part of the opening 14, so that the upper end of target 20 is firmly inserted between the lateral wall of the recess 11b and the shoulder 19a of the tubular sheath 15 (the tightness between the target 20 and the block 11 is ensured by an O-ring 21 disposed in an annular groove in the lateral wall of recess 11b). The lower end of the tubular target 20, which rests by its internal wall against the end-shoulder 19b of sheath 15, is closely surrounded by the lateral wall 22a of a cup-shaped closing element 22, the bottom 22b of which is maintained in close contact against the bottom 16 of the sheath 15 by means of a nut 23 cooperating with a screw 24 integral with the bottom 16 (screw 24 protruding below the bottom 22b through a central hole provided in said bottom 22b). In the annular space between the shoulder 19b of the sheath 15 and the lateral wall 22a of the closing element 22 is mounted an annular spring 27, compressed between the bottom 22b of closing element 22 and the lower end of the target 20 so as to keep the upper end of the target 20 tightly inserted inside the recess 11b of the block 11, whatever the thermal dilatation incurred by the target 20 (the tightness between the lower end of the target 20 and the lateral wall 22a of closing element 22 being ensured by an O-ring 28 disposed in an annular groove in the lateral wall 22a, while the tightness between the respective bottoms 16 and 22b is ensured by an O-ring 29 disposed in an annular groove provided in the upper face of bottom 22b).

The coaxially mounted tubular sheath 15 and tubular target 20 delimitate an annular gas tight chamber 30 of low thickness therebetween, which axially extends from the top metal block 11 to the bottom closing element 22 of the sputtering cathode 10 (the tightness of said chamber 30 being ensured by the respective O-rings 18, 21, 28 and 29). The tubular sheath 15 and tubular target 20 are designed (the internal diameter of the target 20 with respect to the external diameter of sheath 15 and the thickness of the shoulders 19) to delimitate an annular chamber 30 having an internal thickness preferably between 0.1 and 0.3 mm (thickness exaggerated with respect to the other dimensions on the drawing, for purposes of illustration).

This annular gas tight chamber 30 is connected to the outside of the sealed enclosure 3, in the upper end-shoulder 19a of the sheath 15, through a plurality of equiangularly spaced axially extending channels 31 (two of them being shown in dotted lines on FIG. 1) emerging in an annular groove 32, which in turn freely communicates with the outside by means of a conduit 33 pierced through the block 11. The outside emerging end of the conduit 33 is in turn connected to the first branch of a four-branch junction 34, the second branch of which is connected via a valve 35 to a suitable pumpting device (not shown), the third branch of which is connected via a gauged valve 36 to a source 37 of a high thermally-conducting gas (such as helium), and the fourth branch of which is connected to a pressure gauge 38.

The open top 17 of the tubular sheath 15 is closed by a plane cover 40 resting on the upper plane face of the flange 17a (the tightness between the cover 40 and the flange 17a being ensured by an O-ring 41 disposed in an annular groove in the upper face of the flange 17a). Through a central circular opening 40a in the cover 40 is inserted a cylindrical stud 43 (the tightness between the cover 40 and the stud 43 being ensured by an adequate O-ring 42), to the lower end of which is connected a soft iron rod 44 with a square cross-section, which centrally extends inside the tubular sheath 15 substantially along the whole length of the annular chamber 30.

Figure 2:
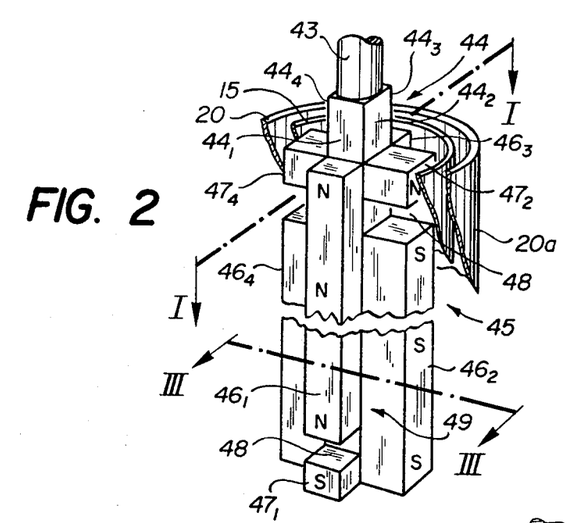
FIG. 2 is a perspective view of the cathode of this first embodiment, drawn to a larger scale.
Figure 3:
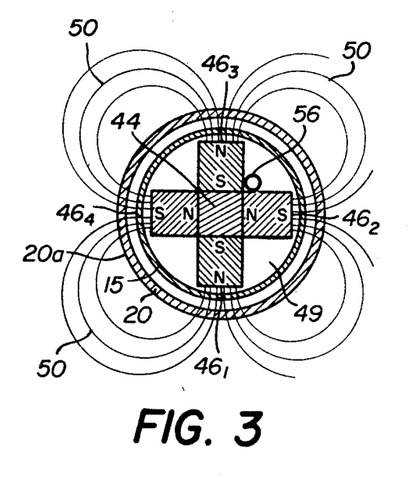
FIG. 3 is a cross-sectional view according to line III—III of FIG. 2.
Figure 4:
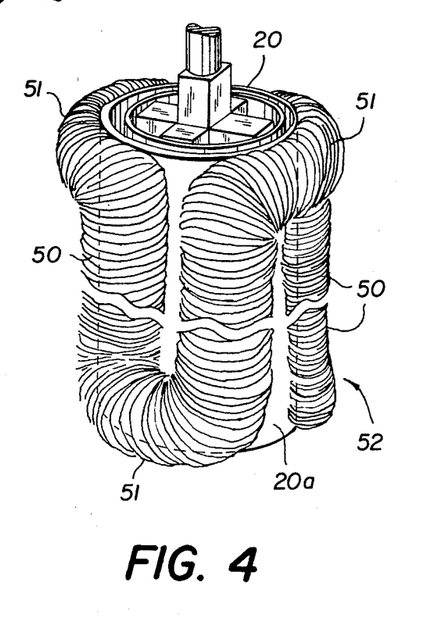
FIG. 4 is a perspective view similar to that of FIG. 2, showing the outside of the cathode.

Around this soft iron central rod 44 is mounted a magnet assembly 45, designed for generating magnetic fields having flux lines which project in a curve from the outer sputtering face 20a of the tubular target 20 and return thereto to form arch portions thereover (flux lines successively traversing the tubular sheath 15 and the tubular target 20 made of non-magnetic materials). This magnet assembly 45, which is better shown on the perspective view of FIG. 2 (magnet assembly 45 shown in FIG. 1 in a sectional view according to lines I—I of FIG. 2), consists of a plurality of equiangularly spaced axially extending radially magnetized magnets $46_1$ to $46_4$ and $47_1$ to $47_4$, which are arranged against the four longitudinal faces of the central rod 44 in the following manner:

parallelepipedic magnets $46_1$ and $46_3$, coupled by their south pole faces against the respective opposite faces $44_1$ and $44_3$ of the central rod 44 so as to have their north pole faces pointing in the vicinity of the inner wall of the tubular sheath 15, the said parallelepipedic magnets $46_1$ and $46_3$ extending along the central rod 44 from its upper end portion to an intermediate portion situated immediately upward its lower end portion, parallelepipedic magnets $46_2$ and $46_4$, coupled by their north pole faces against the respective opposite faces $44_2$ and $44_4$ of the central rod 44 so as to have their south pole faces pointing in the vicinity of the inner wall of the tubular sheath 15, the said parallelepipedic magnets $46_2$ and $46_4$ extending along the central rod 44 from its lower end portion to an intermediate portion situated immediately below its upper end portion, cubic end-magnets $47_1$ and $47_3$, coupled against the lower end portion of the respective opposing faces $44_1$ and $44_3$ of the central rod 44 so as to extend in the prolongation of the corresponding parallelepipedic magnets $46_1$ and $46_3$ while being separated from the latter by gaps 48, the cubic end-magnets $47_1$ and $47_3$ being coupled by their north pole faces against the lower end portions of the opposing faces $44_1$ and $44_3$ so as to have their south pole faces pointing in the vicinity of the inner wall of the tubular sheath 15, and, cubic end-magnets $47_2$ and $47_4$, coupled against the upper end portion of the respective opposing faces $44_2$ and $44_4$ of the central rod 44 so as to extend in the prolongation of the corresponding parallelepipedic magnets $46_2$ and $46_4$ while being separated from the latter by gaps 48, the cubic end-magnets $47_2$ and $47_4$ being coupled by their south pole faces against the upper end portions of the opposing faces $44_2$ and $44_4$ so as to have their north pole faces pointing in the vicinity of the inner wall of the tubular sheath 15.

The magnet assembly 45 consists of the plurality of magnets $46_1$ to $46_4$ and $47_1$ to $47_4$ inserted inside the tubular sheath 15 and is therefore arranged in such a manner as to generate flux lines which form over the outer sputtering face 20a of the tubular target 20 (FIGS. 3 and 4) four equiangularly spaced axially extending straight arch portions 50 alternately connected to one another by four arcuate arch end-portions 51, whereby defining a single closed-loop arch 52 extending in a meandering manner over the entire circumference of the sputtering face 20a of the tubular target 20.

The upper end of the cylindrical stud 43 protruding outside the cover 40 is connected (FIG. 1) to the shaft of a motor 55, designed for slowly rotating the magnet assembly 45 according to a to-and-fro rotatory movement, of an amplitude sufficient (about ±45°) for enabling the single closed-loop arch 52 generated by the magnet assembly 45 to be periodically scanned over the entire surface of the sputtering face 20a.

The closed tubular sheath 15 containing the magnet assembly 45 is provided with a circuit for circulating a liquid coolant such as cold water. This circuit comprises at least one admission conduit 56 extending from the outside of the cover 40 to near the bottom 16 of the sheath 15 (while traversing the magnet assembly 45 by extending along the corner of one of the longitudinal spaces 49 delimitated between the equiangularly spaced magnets 46 and 47), so as to bring the liquid coolant down to the bottom 16 of the sheath 15 (outside protruding end of the conduit 56 connected to a suitable liquid coolant source not shown on the drawing). The liquid coolant can then freely flow upwards, by circulating along the free longitudinal spaces 49 delimitated between the equiangularly spaced different magnets 46 and 47, before being evacuated through an evacuating port 57 provided in the cover 40.

Inside the sealed enclosure 3 is disposed a tubular metal substrate 59 to be internally coated, arranged coaxially around the tubular target 20 of the central cylindrical cathode 10. The tubular metal substrate 59 is connected to ground (as well as the metal enclosure 3), while the central cathode 10 is connected via a switch 60 and an ammeter 61 to the negative pole of a high-voltage source 62 whose other pole is also grounded.

The above apparatus finally comprises a control circuit 64, connected by its input to the pressure gauge 38 and by its output to the switch 60. This control circuit 64 is designed for triggering the opening of the switch 60, as soon as the pressure recorded by the gauge 38 undergoes a sudden decrease with respect to a predetermined value.

The above described sputtering apparatus operates in the following manner:

The cylindrical cathode 10 is provided with a new unconsumed target 20, the sealed enclosure 3 is evacuated and an argon atmosphere of the order $10^{-4}$ to $10^{-2}$ torr is introduced therein. Concurrently, the annular chamber 30 of the cathode 10 is evacuated (by pumping means connected to the valve 35) and a helium atmosphere of about 10 torr is introduced therein (by means of the gauged valve 36 connected to the helium source 37).

The liquid coolant is circulated inside the tubular sheath 15 of the cathode 10, the switch 60 is closed, thereby causing the application of a negative high voltage to said cathode 10.

The negative biasing of the cathode 10 produces a glow discharge, which causes ionization of the argon atoms. The argon ions thus formed bombard the sputtering face 20a of the tubular target 20, thereby causing the ejection (or sputtering) of atoms from the sputtering face 20a, which sputtered atoms are then deposited by condensation on the internal face of the tubular substrate 59.

The presence of the magnet assembly 45 inside the cylindrical cathode 10 confines the discharge plasma (ionization region) within the closed-loop endless arch 52 formed over the sputtering face 20a by the flux lines of the magnet assembly 45, and produces a very high intensification of this discharge plasma. The closed-loop endless arch 52 generated by the magnet assembly 45, which acts with respect to the secondary electrons emitted by the target 20, as a trapping means, compels these secondary electrons to circulate along an extended continuous path around the sputtering surface 20a instead of directly migrating towards the anode, thereby drastically increasing the probability of ionizing collisions with argon atoms. The production of such an intense and confined discharge plasma therefore results in an intense ion bombardment of the sputtering face 20a of the target 20 (large ion current bombardment of the cathode), thereby causing an intense sputtering of the target 20, and thus the coating with a high deposition rate of the internal face of the tubular substrate 59.

The intense ion bombardment to which the target 20 is submitted causes a high power dissipation at the target, thereby requiring a sufficient target cooling throughout the sputtering to prevent damage to the system (possible deterioration of the target 20, and/or overheating of the substrate 59, and/or demagnetization of the magnet assembly 45). The double cooling system, i.e. the closed tubular sheath 15 containing the magnet assembly 45, which is provided with a liquid coolant circuit, and the thin annular chamber 30 coaxially extending between this tubular sheath 15 and the back of the target 20, which is provided with an atmosphere of a high thermally conducting gas such as helium. The interposition of a thin stagnant helium layer between the target 20 and the sheath 15 despite the high power dissipation at the target, enables a permanent heat transfer from the target 20 to the sheath 15 (through the helium layer) which will keep the temperature of the target 20 down to permissible values of about 500° C. It is necessary that the temperature of the sheath 15 is maintained near the ambient value, which is ensured by the liquid coolant circulated inside the sheath 15, which continuously evacuates towards the outside the heat continuously transferred through the thin helium gas layer. The evacuation of such heat towards the outside is enhanced as the liquid coolant freely circulates along the longitudinal spaces 49 delimitated between the equiangularly spaced different magnets 46 and 47, i.e. along longitudinal spaces 49 which extend in front of the regions of the target 20 where the sputtering (and thus the power dissipation) is the more intense.

As the sputtering proceeds, the target 20 undergoes a progressive erosion, which would remain localized in the regions covered by the closed-loop arch 52 formed by the flux lines of the magnet assembly 45. The motor 55 rotates the magnet assembly 45 slowly according to an oscillatory rotatory movement with respect to the target 20 to ensure a uniform erosion of said target 20 (whereby resulting in an improved target life), by periodically scanning the closed-loop arch 52 (and thus the intense discharge plasma confined inside said arch 52) over the entire surface of the sputtering face 20a. The uniformity of the target erosion is enhanced with a single closed-loop plasma meandering over the entire circumference of the sputtering face, whereby resulting in a uniform plasma current along its whole path. The slowly oscillating rotation of the magnet assembly 45 with respect to the substrate 59, gives rise to an excellent uniformity of the internal coating of the substrate 59.

When the substrate 59 is provided with a uniform coating of desired thickness, the sputtering operation is stopped to replace the coated substrate with a new uncoated one, and the sputtering operation can then be resumed. The sputtering target 20 continues to be progressively eroded, until it is eventually pierced. Such a piercing is totally harmless since a simple irruption of helium inside the sealed enclosure 3, which is immediately detected by the pressure gauge 38 (gauge 38 detecting a sudden decrease of helium pressure inside the annular chamber 30) for controlling, by means of the controlling circuit 64, the automatic opening of the switch 60 of the sputtering apparatus. The consumption of the pierced target 20 has been optimized and can be removed from the sealed enclosure and replaced at which time the sputtering operation can then be resumed.

The coating of each substrate 59 may be preceded by a cleaning step, which may be carried out by negatively biasing the substrate 59 while the cylindrical cathode 10 is grounded (the biasing is the reverse of that applied during the coating, and gives rise to a glow discharge causing the proper sputtering of the substrate).

The motor 55 for moving the magnet assembly 45 may be designed for rotating this assembly 45 according to a unidirectional rotatory movement instead of the to-and-fro rotatory movement (the admission conduit 56 extending along one of the channels 49 of the magnet assembly 45 being replaced by a borehole, pierced through the stud 43 and the rod 44 so as to axially extend from the upper end of the stud 43 to the lower end of said rod 44), which causes full revolutions of the magnet assembly 45 with respect to the tubular target 20 and the substrate 59, thereby resulting in good uniformity of target sputtering and substrate coating.

Another variation involves a slight modification of the "mounting" design of the tubular target 20 and of the substrate 59, so as to rotate both the target 20 and the substrate 59 with respect to the magnet assembly 45, also resulting in good uniformity of target sputtering and substrate coating.

EXAMPLE

The sputtering apparatus of FIGS. 1 to 4 is used for depositing a stainless steel coating of about 10 μm thick (for corrosion protection purposes) on the internal surface of soft iron tubes having a length of the order of 400 mm and an internal diameter of about 70 mm.

The sputtering apparatus of FIGS. 1 to 4 uses a cylindrical cathode 10 presenting the following structural parameters:

tubular sheath 15 made of copper, with an external diameter of about 31.6 mm, tubular target 20 made of 18/8 stainless steel (stainless steel 304 according to US designation), with an internal diameter of about 32 mm (tubular sheath 15 and tubular target 20 therefore delimitating an annular chamber 30 having a thickness of the order of 0.2 mm), and the thickness of the tubular target 20 is about 1.5 mm, with an overall length of the order of 500 mm (tightness at both ends ensured by O-rings 21 and 28 made of Viton), magnet assembly 45 generates in the vicinity of the sputtering face 20a of the target 20 magnetic fields having a strength of about 300 to 800 oersteds (depending on the actual erosion level of the target), the magnet assembly 45 being arranged inside the target 20 causing the erosion of the target along a length of about 450 mm.

A soft iron tube 59 to be coated is arranged concentrically around the cylindrical cathode 10, and the sealed enclosure 3 is evacuated to a pressure of about $1 \times 10^{-5}$ mbar (via the valve 5), simultaneously with the chamber 20 (via the valve 35). The valve 35 is then closed, and an atmosphere of helium up to a pressure of about 10 mbar is introduced inside the chamber 20 (via the gauged valve 36), while an atmosphere of argon up to a pressure of about $2 \times 10^{-2}$ mbar is provided inside the main enclosure 3 (via the valve The soft iron tube 59 is then submitted to a short cleaning prior to its coating, by biasing the iron tube 59 to a value of about −500 to −1000 volts while the magnetron cathode 10 is grounded (the glow discharge appearing between the tube and the magnetron cathode is maintained during about 5 min., causing a sputtering of the internal surface of the tube which is sufficient for cleaning).

After the cleaning is completed (by switching off the above biasing), the pressure of argon inside the main enclosure 3 is decreased up to about $4 \times 10^{-3}$ mbar. The tube 59 is then grounded, while the magnetron cathode 10 is connected via the switch 60 (as shown on the drawing) to the negative pole of a DC power supply 62 delivering up to 12 amps at about 500 volts (the power supply 62 being protected against arcing by a current limiter). The deposition rate onto the internal surface of the tube is about 6 um per kWh consumed, while the corresponding target erosion rate is about 12 um per kWh consumed. Using a power of 6 kW, the desired coating of about 10 um thick is deposited onto the internal surface of the tube is in about 17 min. Under the above conditions, the maximum temperature reached by the target is about 500° C. in the sputtering zone, while not exceeding 200° C. at both ends (i.e. in the vicinity of the O-rings 21 and 28).

Figures 5, 6, 7:
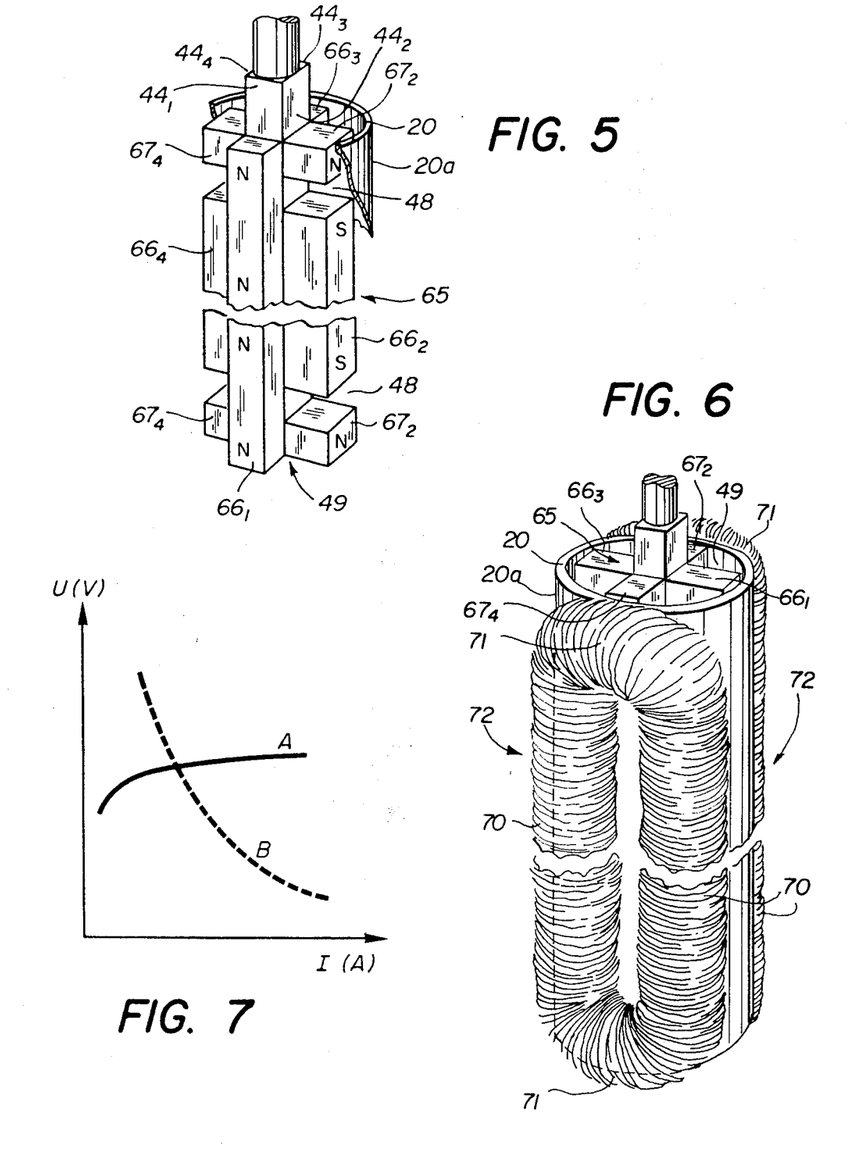
FIG. 5 is a perspective view similar to that of FIG. 2, showing one variation of the cathode element illustrated on the FIG. 2.
FIG. 6 is a perspective view similar to that of FIG. 5, showing the outside of the cathode (cathode rotated by 90°/FIG. 5).
FIG. 7 is a typical voltage-current graph illustrating the above embodiment and variation.

The FIGS. 5 and 6 illustrate one variation of the magnetron of the first embodiment of FIGS. 1 to 4 (the unchanged elements keeping the same figures of reference on the drawing), designed for generating two closed-loop magnetic arches diametrically opposed over the sputtering face of the tubular target, instead of a single closed-loop magnetic arch meandering over the entire circumference of this sputtering face (the intermediate tubular sheath 15 being furthermore suppressed in this variation, so as to enable the liquid coolant to be circulated directly along the back face of the tubular target 20). The magnetron 65 represented in FIGS. 5 and 6 consists of a plurality of equiangularly spaced axially extending radially magnetized magnets 66 and 67, which are arranged against the four longitudinal faces of the central rod 44 in the following manner (FIG. 5):

parallelepipedic magnets $66_1$ and $66_3$, coupled by their south pole faces against the respective opposite faces $44_1$ and $44_3$ of the central rod 44 so as to have their north pole faces pointing in the vicinity of the inner wall of the tubular target 20, the parallelepipedic magnets $66_1$ and $66_3$ extending along the central rod 44 from its upper to its lower end portion, parallelepipedic magnets $66_2$ and $66_4$, coupled by their north pole faces against the respective opposite faces $44_2$ and $44_4$ of the central rod 44 so as to have their south pole faces pointing in the vicinity of the inner wall of the tubular target 20, the parallelepipedic magnets $66_2$ and $66_4$ extending along the central rod 44 from a first intermediate portion situated immediately below its upper end portion to a second intermediate portion situated immediately above its lower end portion, and, cubic end-magnets $67_2$ and $67_4$, coupled against the end portions (upper as well as lower portions) of the respective opposing faces $44_2$ and $44_4$ of the central rod 44 so as to extend in the prolongation of both ends of the corresponding magnets $66_2$ and $66_4$ while being separated from the latter by gaps 48, the cubic end-magnets $67_2$ and $67_4$ being coupled by their south pole faces against the corresponding end-portions of the opposing faces $44_2$ and $44_4$ so as to have their north pole faces pointing in the vicinity of the inner wall of the tubular target 20.

The above magnetron 65 directly arranged against the back face of the tubular target 20 is designed to generate flux lines which form over the outer sputtering face 20a of this target 20 four equiangularly spaced axially extending straight arch portions 70 connected by pairs to corresponding arcuate arch end-portions 71, whereby defining two diametrically opposed closed-loop arches 72 completely separate from each other, each of which extends over one quarter of the sputtering face 20a.

In operation, the presence of the magnetron 65 causes the formation, over the sputtering face 20a of the target 20, of two separate closed-loop plasmas confined within the two closed-loop arches 72, causing an intense sputtering of the target 20 (uniform target sputtering is aided by axially rotating the magnetron 65 relatively to the target 20, either in a to-and-fro motion of about ±45° amplititude or in a unidirectional motion). Throughout said sputtering, proper target cooling is ensured by the free circulation of the liquid coolant along the longitudinal spaces 49 delimitated between adjacent magnets of the magnetron 65. The uniformity of target erosion is impaired by the risk of destabilization of the separate plasmas caused by a possible dissymetry.

The diagram of FIG. 7 illustrates a typical voltage-current characteristic related to magnetron sputtering apparatus (curve A in continuous line) which is known for flattening at high currents (mainly for low gas pressure to insure good efficiency), which means that the plasma impedance decreases with increasing current (curve B in dotted lines). The generation of a plurality of separate plasmas act as electrical elements in parallel and constitutes an unstable design, since any current disequilibrium likely to arise between separate plasmas because of an eventual dissymmetry can only worsen with time because of the plasma impedance decrease with current increase. Such a disequilibrium cannot develop in the case of a single meandering plasma (whatever the complexity of its path), since the different branches of a single meandering plasma act as electrical elements in series and produce a relatively uniform plasma current (trapped electrons meandering along the whole path of said single plasma), thereby ensuring stability of a single meandering plasma.

Figure 8:
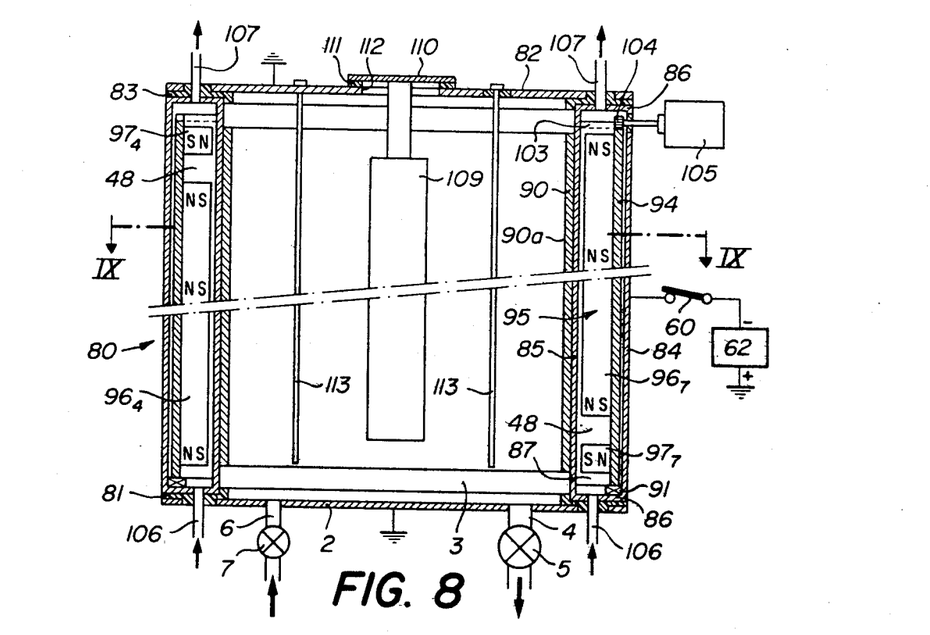
FIG. 8 is a diagrammatic sectional view similar to that of FIG. 1, illustrating a second embodiment.
Figure 9:
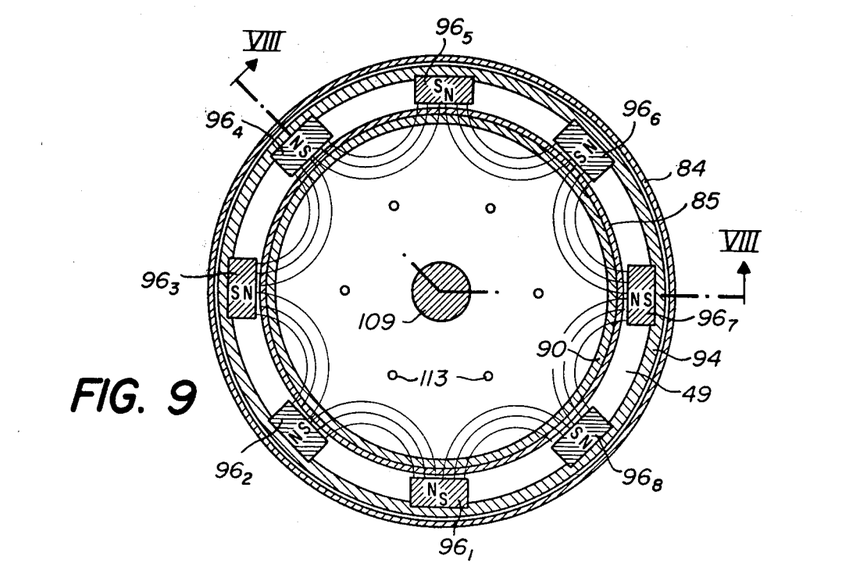
FIG. 9 is a cross-sectional view according to line IX—IX of FIG. 8.
Figure 10:
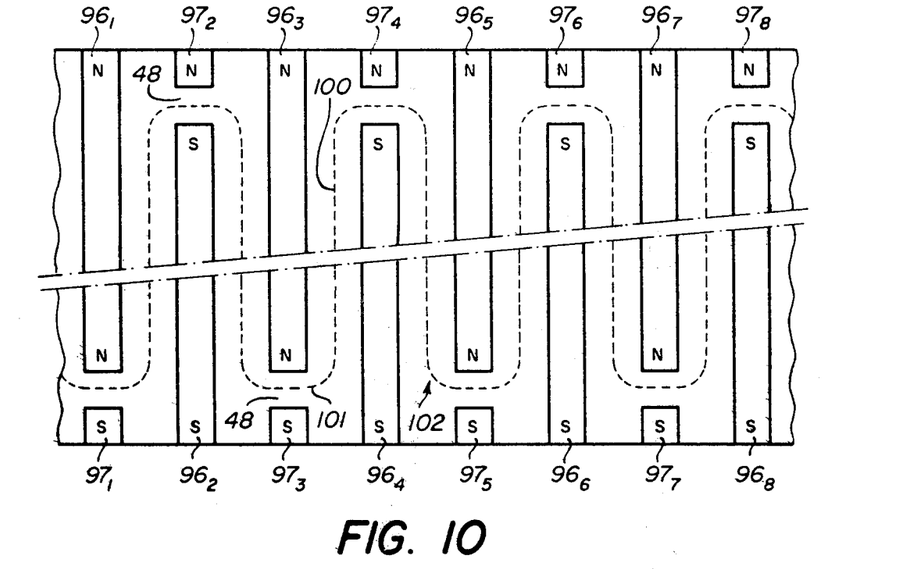
FIG. 10 is a view, developed in the plane, of a particular element of FIGS. 8 and 9.

FIGS. 8 to 10 relate to a second embodiment of the apparatus of the present invention, which makes use of a hollow cylindrical magnetron sputtering cathode disposed concentrically around the axis of the apparatus, so as to enable the external coating of substrates centrally extending along the axis (the elements of the embodiment of FIGS. 8 to 10 which are unchanged with respect to those of FIGS. 1 to 4 maintain the same reference numerals).

The embodiment of FIGS. 8 to 10 comprises (FIG. 8) a hollow cylindrical magnetron sputtering cathode 80 resting (via an insulating ring 81) on a baseplate 2, so as to form, in cooperation with a plane cover 82 closing (via an insulating ring 83) the open top of the hollow cylindrical cathode 80, a sealed enclosure 3 (the enclosure 3 further comprising an evacuation port 4 and an inlet port 6 provided in the baseplate 2).

The hollow cylindrical cathode 80 more specifically comprises two concentric tubular walls 84 and 85, connected at both ends by end-walls 86 so as to delimitate in combination an annular fluid tight chamber 87. Against the external face of the inner wall 85 is mounted a tubular target 90 made of material to be sputtered. Inside the annular chamber 87 is rotatively mounted a tubular support 94 made of soft iron (designed to closely extend against the internal face of the outer wall 84), which rests against the bottom of the chamber 87 by means of an annular ball-bearing 91.

Against the inner face of the tubular support 94 is mounted a magnet assembly 95, which consists of a plurality of axially extending radially magnetized magnets $96_1$ to $96_8$ and $97_1$ to $97_8$, equiangularly spaced against the support 94 in the following manner (FIGS. 9 and 10):

parallelepipedic magnets $96_1$, $96_3$, $96_5$ and $96_7$, equiangularly spaced by 90° from one another around the tubular support 94, and coupled by their south pole faces against the support 94 so as to have their north pole faces pointing in the vicinity of the internal face of the tubular wall 85, the parallelepipedic magnets extending along the support 94 from its upper end-portion to an intermediate portion situated immediately upward its lower end-portion, parallelepipedic magnets $96_2$, $96_4$, $96_6$ and $96_8$, equiangularly spaced by 90° from one another around the tubular support 94 (while being equiangularly spaced by 45° from the corresponding magnets $96_1$, $96_3$, $96_5$ and $96_7$), and coupled by their north pole faces against the support 94 so as to have their south pole faces pointing in the vicinity of the internal face of the tubular wall 85, the parallelepipedic magnets extending along the support 94 from its lower end-portion to an intermediate portion situated immediately below its upper end portion, cubic end-magnets $97_1$, $97_3$, $97_5$ and $97_7$ coupled against lower end-portions of the tubular support 94, so as to extend in the prolongation of the corresponding parallelepipedic magnets $96_1$, $96_3$, $96_5$ and $96_7$ while being separated from the latter by gaps 48, the cubic end-magnets being coupled by their north pole faces against the tubular support 94 so as to have their south pole faces pointing in the vicinity of the internal face of the tubular wall 85, and, cubic end-magnets $97_2$, $97_4$, $97_6$ and $97_8$ coupled against upper end-portions of the tubular support 94, so as to extend in the prolongation of the corresponding parallelepipedic magnets $96_2$, $96_4$, $96_6$ and $96_8$, the cubic end-magnets being coupled by their south pole faces against the support 94 so as to have their north pole faces pointing in the vicinity of the internal face of the tubular wall 85.

The above described magnet assembly 95 mounted inside the tight chamber 87 is arranged to generate flux lines which form over the inner sputtering face 90a of the tubular target 90 eight equiangularly spaced axially extending straight arch portions 100 (shown in dotted lines on the FIG. 10) connected to one another by eight arcuate arch end-portions 101, in an alternating manner whereby defining a single closed-loop arch 102 extending in a meandering manner over the entire circumference of the sputtering face 90a.

The upper edge of the tubular support 94 has an annular toothed rack 103 cooperating with a pinion 104 connected to the shaft of an external motor 105, which motor 105 is designed for slowly rotating the magnet assembly 95 in a to-and-fro oscillatory movement, of an amplitude sufficient (about ±25°) for enabling the single closed-loop arch 102 generated by the magnet assembly 95 to be periodically scanned over the entire surface of the sputtering face 90a.

The fluid tight chamber 87 containing the magnet assembly 95 is provided with a plurality of inlet conduits 106 extending through the insulating ring 81 and the baseplate 2 (while being electrically insulated from this baseplate 2) and with a plurality of outlet conduits 107 adequately extending through the insulating ring 83 and the cover 82 (while being electrically insulated from this cover 82), so that a liquid coolant such as cold water can be continuously introduced through the inlet conduits 106 for being freely circulated along the longitudinal spaces 49, delimitated between adjacent magnets of the magnet assembly 95, before being withdrawn through the conduits 107.

Inside the sealed enclosure 3 is disposed a cylindrical substrate 109 to be externally coated, which centrally extends along the axis of the enclosure 3. This substrate 109 is mounted by its upper end against a discoidal member 110, which closes (via an insulating ring 111) a central opening 112 provided in the plane cover 82. In the interspace between the central cylindrical substrate 109 and the tubular sputtering target 90 is disposed a plurality of equiangularly spaced metal rods 113, which are connected by their upper ends against the internal face of the plane cover 82. The baseplate 2 and the cover 82 are connected to ground, while the hollow cathode 90 is connected via a switch 60 to the negative pole of a high voltage source 62 while the other pole is grounded (the rods 113 electrically connected to the cover 82 are anodes, while the substrate 109 electrically isolated from this cover 82 may have a "floating" potential).

The operation of the above-described apparatus is similar to that previously described:

The sealed enclosure 3 is provided with an atmosphere of argon of the order of $10^{-4}$ to $10^{-2}$ torr, the liquid coolant is circulated inside the tight chamber 87, while a negative high voltage is applied to the hollow cathode 90 (by closing the switch 60). The application of this negative high voltage leads to the formation of a single closed-loop intense plasma confined within the single meandering magnetic arch 102, thereby causing an intense sputtering of the target 90, and a high-rate coating of the central substrate 109. Such a coating has excellent uniformity, because of the periodic scanning of the single meandering plasma over the entire surface of the sputtering target 90, combined with an excellent stability of this single meandering plasma. The proper cooling of the target is by the free circulation of the liquid coolant along the longitudinal spaces 49 delimitated between adjacent magnets of the magnet assembly 95 (which longitudinal spaces 49 extend in front of the portions of the target 90 where the sputtering, and thus the heating up, is the more intense).

According to one variation of the embodiment of FIGS. 8 to 10 the motor 105 for moving the magnet assembly 95 may be designed for rotating this assembly 95 according to a unidirectional rotatory movement instead of the to-and-fro rotatory movement previously described, so as to cause full revolutions of this magnet assembly 95 with respect to the tubular target 90 and the central substrate 109, thereby resulting in good uniformity of target sputtering and substrate coating (which may be improved by equally rotating the central substrate 109).

Figure 11:
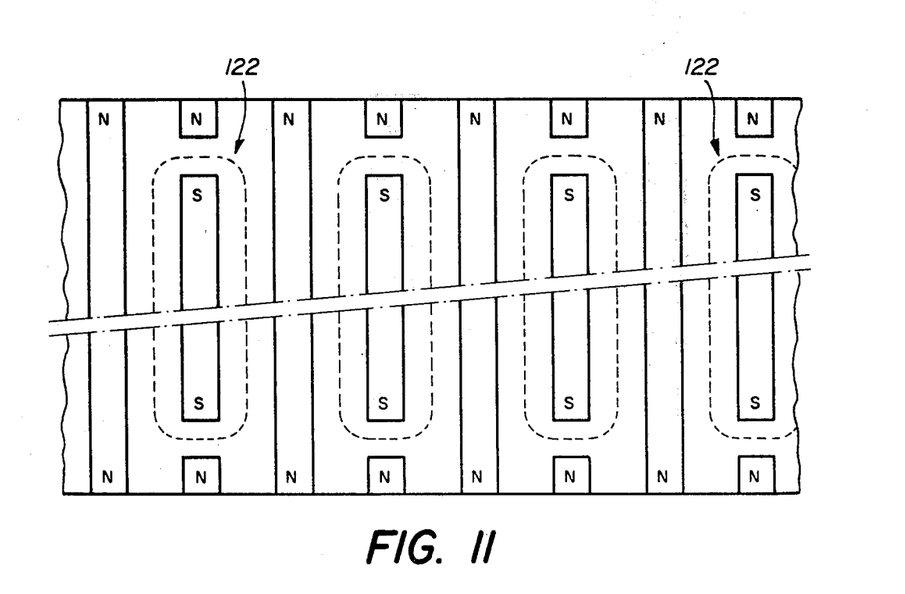
FIG. 11 is a view similar to that of FIG. 10, illustrating one variation of the element.

The FIG. 11 illustrates one variation of the magnet assembly used in the embodiment of FIGS. 8 to 10, which is designed for generating flux lines forming over the sputtering face of the tubular target four closed-loop magnetic arches 122 equiangularly spaced by 90° from one another, instead of the single closed-loop arch 102.

Although the present invention has been specifically disclosed with preferred embodiments and drawings, variations of the concepts herein disclosed may be resorted to by those skilled in the art and such variations are considered to be within the scope of the invention and appended claims.

We claim:

1. An improved cylindrical magnetron cathodic sputtering apparatus for coating a substrate with a material from a tubular target within an evacuated sealed enclosure, in which magnetic fields enhance the sputtering of the tubular target, said target having a sputtering face of the material to be sputtered and a back face opposed to the sputtering face, wherein the improvement comprises:

a magnet assembly that is radially magnetized, disposed behind the back face of the tubular target, having a plurality of equiangularly spaced, axially extending magnets and designed to generate a magnetic flux of straight arch portions connected to arcuate end portions which combine to project at least one intense, closed-loop plasma over the sputtering face of the tubular target.

2. An improved cylindrical magnetron cathodic sputtering apparatus as in claim 1 wherein the plurality of magnets is arranged to form a single closed-loop intense plasma extending in a meandering manner over the sputtering face of the sputtering target.

3. An improved cylindrical magnetron cathodic sputtering apparatus as in claim 2 wherein the sputtering face of the tubular target is its outer face, and the magnet assembly is inserted inside the tubular target.

4. An improved cylindrical magnetron cathodic sputtering apparatus as in claim 2 wherein the sputtering face of the tubular target is its inner face and the magnet assembly is circumferentially arranged around the outer face of the tubular target.

5. An improved cylindrical magnetron cathodic sputtering apparatus as in claim 2 further comprising means for axially rotating the magnet assembly relative to the tubular target and relative to the substrate according to a to-and-fro rotatory movement.

6. An improved cylindrical magnetron cathodic sputtering apparatus as in claim 2 further comprising means for a unidirectional rotatory movement causing full revolutions of the magnet assembly relative to the tubular target and to the substrate.

7. A cylindrical magnetron sputtering cathode comprising:
A. a tubular target having a sputtering face of a material to be sputtered and a back face opposed to the sputtering face;
B. a magnet assembly that is radially magnetized, disposed behind the back face of the tubular target and having a plurality of equiangularly spaced axially extending magnets with longitudinal spaces between adjacent magnets, wherein the magnet assembly is designed to generate a magnetic flux of straight arch portions connected to arcuate end-portions which combine to project at least one intense, closed-loop plasma over the sputtering face of the tubular target; and
C. means for continuously cooling the target with a liquid coolant that is freely circulated along the longitudinal spaces between the adjacent magnets.

8. Cylindrical magnetron sputtering cathode as in claim 7 wherein the plurality of magnets is arranged to form a single closed-loop intense plasma meandering over the sputtering face of the tubular target.

9. Cylindrical magnetron sputtering cathode as in claim 8 wherein the sputtering face of the tubular target is its outer face, and the magnet assembly is inserted inside the tubular target.

10. Cylindrical magnetron sputtering cathode as in claim 8 wherein the sputtering face of the tubular target is its inner face, and the magnet assembly is circumferentially arranged around the outer face of the tubular target.

11. Cylindrical magnetron sputtering cathode as in claim 8 further comprising means for axially rotating the magnet assembly with respect to the target.

* * * * *